United States Patent [19]

Sakurai et al.

[11] 4,190,775
[45] Feb. 26, 1980

[54] OPTICAL MEMORY PLAYBACK APPARATUS

[75] Inventors: Kenjiro Sakurai; Junichi Shimada, both of Tokyo; Takitaro Morikawa, Sayama; Yoshinobu Mitsuhashi, Tokyo; Satoshi Ishihara, Tanashi; Atsuya Seko, Higashi-Murayama; Tetsutaro Yasuhira, Tokyo, all of Japan

[73] Assignee: Agency of Industrial Science & Technology, Tokyo, Japan

[21] Appl. No.: 919,275

[22] Filed: Jun. 26, 1978

Related U.S. Application Data

[63] Continuation-in-part of Ser. No. 658,770, Feb. 17, 1976, abandoned.

[30] Foreign Application Priority Data

Feb. 18, 1975 [JP] Japan .................................. 50-19472
Apr. 28, 1975 [JP] Japan .................................. 50-50732

[51] Int. Cl.² .......................................... G06K 7/10
[52] U.S. Cl. .................................. 250/570; 250/211 J
[58] Field of Search ............... 250/211 R, 211 J, 570; 358/128; 350/160 R; 179/100.3 V, 100.3 Z

[56] References Cited

U.S. PATENT DOCUMENTS

| 3,715,733 | 2/1973 | Feiner et al. |
| 3,775,757 | 11/1973 | Taylor et al. |
| 3,812,477 | 5/1974 | Wieder |
| 3,941,945 | 3/1976 | Borner |
| 4,005,259 | 1/1977 | Kaneko |

Primary Examiner—David C. Nelms
Assistant Examiner—Darwin R. Hostetter
Attorney, Agent, or Firm—Oblon, Fisher, Spivak, McClelland & Maier

[57] ABSTRACT

Disclosed is an optical memory playback apparatus using an electroluminescent semiconductor element as a combination light source and sensor, which apparatus permits information in an information storage medium to be reproduced in the form of variation in electrical characteristics of the semiconductor element by causing a beam of light issuing from the electroluminescent semiconductor element to be directed to the information storage medium, allowing the light reflected by the information storage medium to impinge on the semiconductor element for thereby inducing variation in the optical and electrical characteristics of the semiconductor element owing to the self-coupling effect.

3 Claims, 10 Drawing Figures

OPTICAL MEMORY PLAYBACK APPARATUS

REFERENCE TO COPENDING APPLICATION

This is a continuation-in-part application of our copending application U.S. Ser. No. 658,770 filed Feb. 17, 1976, now abandoned.

BACKGROUND OF THE INVENTION

This invention relates to an optical memory playback apparatus using an electroluminescent semiconductor element.

As means for collecting and reproducing bits of information by the medium of a light beam there has, for instance, been proposed an apparatus in which the light radiated from a helium-neon laser is directed to bits of information stored in the spiral groove of a disk as in an information-storing videodisk. This apparatus has a disadvantage that it cannot effectively operate without using a relatively large light source and a relatively large optical system which enables the light from the light source to travel in the direction of the information-storing part of the disk and, upon impingement thereon, reflect in the direction of a photo-detector.

As is well known, a minute electroluminescent semiconductor device on the hundred $\mu m$ order is commercially available in the form of a light emitting diode or semiconductor laser. U.S. Pat. No. 3,812,477 teaches a minute semiconductor laser which is capable of reading bits of information out of a compact-storing memory with high resolution.

In the information processing system contemplated by this U.S. patent, a three-mirror resonator is constructed of an outer mirror and a laser element, whereby information stored in the form of variation in the reflection factor on the outer mirrors is read out by allowing the variation in the light output (namely the presence or absence of oscillation) of the laser element produced in consequence of the variation in the reflection factors of the outer mirrors to be detected by a separately installed photo-detector.

The signal playback system disclosed in U.S. Pat. No. 3,941,945 effects the reading of information by relying on the same operating principle and structure as the invention of the U.S. patent mentioned above, except that the laser element and the detector element are produced monolithically.

In the signal reproducing system disclosed in U.S. Pat. No. 4,005,259, when the light radiated from a semiconductor laser having an antireflection coating applied to one end surface thereof is reflected by an outer mirror back to the laser, a resonator is formed between the outer mirror and the laser. In this system the reading of information is accomplished by the photo-sensor which detects the variation in the light output which occurs when the outer mirror acquires a reflection factor high enough to cause laser oscillation.

The information processing devices disclosed in the aforementioned U.S. patents invariably require outer mirrors to function as component parts of laser resonators and, therefore, are susceptible to erroneous operation due to minute vibrations arising in these outer mirrors. Thus, as constant rigid alignment of the component parts is required to ensure perfect accuracy of operations, these devices have room for further improvement.

An object of the present invention is to provide a very minute optical memory playback apparatus possessing a greatly simplified structure.

Another object of this invention is to provide an optical memory playback apparatus which, owing to the utilization of the self-coupling effect, permits free selection of the length of the light path between the light source and the reflecting object serving as an information storage medium.

Still another object of this invention is to provide an optical memory playback apparatus which never produces an erroneous read-out.

The term "coupling effect" as herein used is defined as the phenomenon which is observed when an electroluminescent semiconductor subjected to light irradiation is undergoing changes in carrier density and changes in the course of carrier recombination, which changes either result in the pumping, quenching or extinguishing of the light output of the semiconductor or induce optical changes as in the mode or polarization of the light. The term "self-coupling effect" refers to a particular type of "coupling effect" that is brought about by the light emitted from one and the same electroluminescent semiconductor.

The term "memory playback" as herein used is defined as the act of reproducing, by opto-electronic means using an electroluminescent semiconductor element, the information stored along an information track in the form of variation in the optical characteristics of an optical storage medium.

SUMMARY OF THE INVENTION

To accomplish the objects described above according to the present invention, there is provided an optical memory playback apparatus which comprises a medium having information stored therein in the form of an arrangement of reflective portions and non-reflective portions, an electroluminescent semiconductor element adapted to emit a light through one end surface thereof for reading out the information from the medium; a rod lens serving to lead the light emitted from the electroluminescent semiconductor element onto the medium and return the light reflected from the medium to the terminal surface of the electroluminescent semiconductor element; a cartridge having the aforementioned electroluminescent semiconductor element and rod lens incorporated therein with their optical axes coinciding with each other; a cartridge holder drive unit having the aforementioned cartridge held in a state freely movable in the lateral direction and the perpendicular direction with respect to the medium; a signal processing unit serving to detect the change in terminal voltage of the electroluminescent semiconductor element due to the self-coupling effect brought about by the returned light from the medium; and an information reproduction unit for reproducing the information in accordance with the signal received from the signal processing unit.

The optical memory playback apparatus of the present invention has a very simple structure as described above and, therefore, can be constructed in a minute size. Since the present invention utilizes the self-coupling effect, the length of the light path from the light source to the medium can be freely selected. Since the focussing and tracking of the light reaching the optical memory medium can be carried out by processing the signal from the signal processing unit and feeding back the processed signal to the cartridge holder driver, the apparatus of this invention is completely safe from incorrect reading of information.

The other objects and characteristics of the present invention will become apparent from the detailed description to be given hereinafter with reference to the accompanying drawing.

DESCRIPTION OF THE PREFERRED EMBODIMENT

Figure 1:
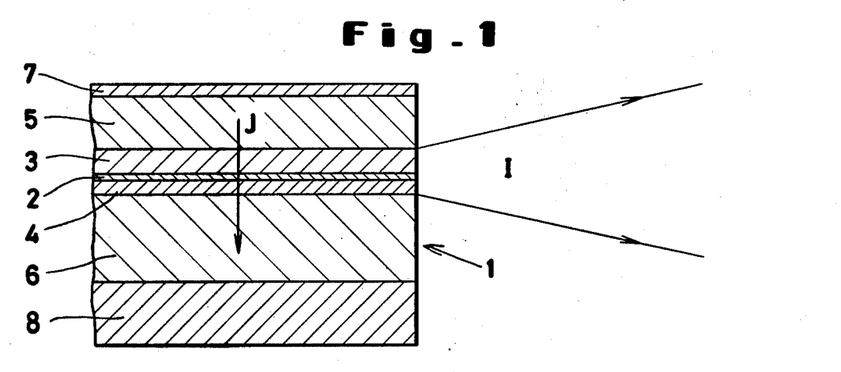
FIG. 1 is an enlarged sectional view illustrating the electroluminescent semiconductor element for use in the optical memory playback apparatus according to the present invention.

The electroluminescent semiconductor element to be used in the present invention will be described with reference to FIG. 1.

Semiconductor elements of this category have heretofore been developed in various structures. As a typical example, the basic structure for junction-type electroluminescent semiconductor elements is illustrated in FIG. 1. The junction-type semiconductor element 1 comprises an activated layer 2, a p-type light guide layer 3 formed on the upper surface of the activated layer, an n-type light guide layer 4 formed on the lower surface of the activated layer, a p-type region 5 and an n-type region 6 formed respectively on the outsides of the two light guide layers 3, 4, a positive electrode 7 and a negative electrode 8.

Figure 2:
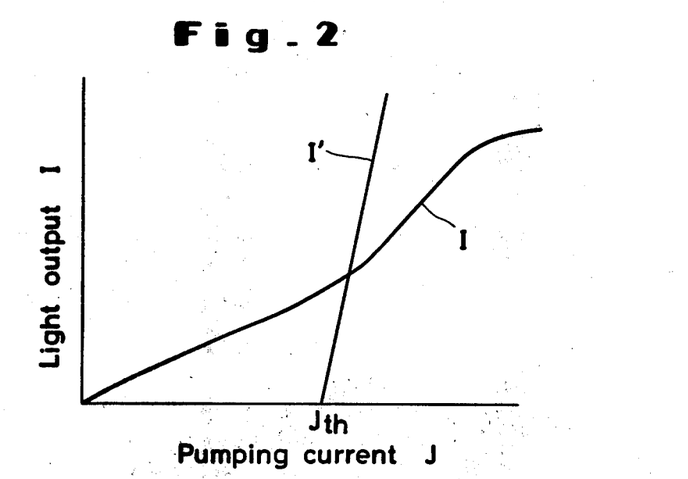
FIG. 2 is a graph showing the relation between the light output and the pumping current of the electroluminescent semiconductor element.

When an electric current "J" flowing from the p-type region 5 to the n-type region 6 enters the portion of the activated layer 2 which falls on the p-n junction, the activated layer 2 generates light, which is forwarded to the light guide layers 3, 4 and released in the form of light output "I" through the end surface of the semiconductor element 1. In this case, the light is radiated along a path which diverges at an angle determined by the thickness of the light guide layers 3, 4. The magnitude of the light output varies with that of the pumping current "J" as shown in FIG. 2. The light output "I" from the semiconductor element increases in proportion to the pumping current "J" so far as the magnitude of this pumping current is relatively small. As the pumping current reaches and exceeds a certain level, the light output sharply rises and tends to reach saturation as shown by the curve "I" in FIG. 2. In the case of a semiconductor laser, no laser beam is emitted from the semiconductor laser when the magnitude of the pumping current is small. As the pumping current increases above a fixed threshold value "$J_{th}$", there will ensue a laser oscillation as shown by the curve "I" in FIG. 2, thus inducing radiation of a laser beam from the semiconductor laser. This non-linear relation between the pumping current "J" and the light output "I" or "I'" of the light emitting diode or semiconductor laser is well known.

The coupling effect which is brought about when a semiconductor laser is exposed to another laser light radiated at the same wavelength will be described below. When the semiconductor laser is in a state capable of generating oscillation and when the laser is exposed to a laser light radiated by another semiconductor laser at the same wavelength, the gain in amplification of the first semiconductor laser is such as to initiate oscillation or enhance the oscillation already in progress. This phenomenon which originates in the coupling effect will appear for a very brief duration (less than $10^{-9}$ second). In an experimental optical computing apparatus using this phenomenon which has been made by the inventors, the optical computation can be effected by exposing one laser element to the light radiated from another laser element. The coupling effect cannot be brought about unless the wavelength of the laser light from one of the two semiconductor lasers is equal to that of the laser light from the other.

Figure 3:
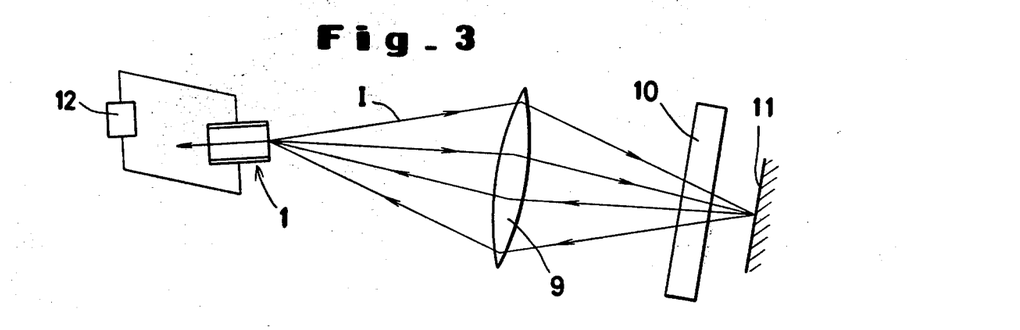
FIG. 3 is an explanatory view illustrating the principle of the optical memory playback apparatus according to the present invention.

The optical memory playback apparatus of the present invention makes positive use of the coupling effect. Specifically as shown schematically in FIG. 3, the apparatus is so constructed that a light beam "I" radiated from a sole electroluminescent semiconductor element 1 is directed through a lens 9 to a medium 10 having bits of information stored therein, and the light consequently modulated is reflected by a mirror 11 back to the original semiconductor element 1. The light thus returned has an effect on the opto-electronic characteristics of the element and produces variation in the light output. At the same time, the terminal voltage of the element shows a change peculiar to the effect mentioned above. This change is obtained by a circuit 12 which is electrically connected to the element 1.

In the optical memory playback apparatus of the present invention which utilizes the self-coupling effect described above, since the light or laser light emitted from the sole semiconductor element is reflected so as to be received by the same element, the indispensable equality of wavelength between the emitted light and the received light is ensured. Thus, the sole semiconductor element can be advantageously used as a combination light source and sensor.

In other words, since the self-coupling effect is brought about very easily and further since the variation caused in the electrical characteristics of the element itself can be advantageously utilized, the apparatus of this invention enables the optical memory playback to be carried out without requiring use of any additional light detecting element.

Now, the basic operating principle of the optical memory playback apparatus of this invention using the basic construction portrayed above will be described with reference to FIG. 4. The light "I" which has emanated from one end surface of the electroluminescent semiconductor element 1 is converged by means of a rod lens 13 capable of focusing light by the same principle as the self-focusing optical fiber, then led toward the optical memory medium 14 and focused thereon. On this optical memory medium 14, the information is stored in the form of variation in the reflection factor. That portion of the incident light which is proportional to the value of reflection factor at the position of light incidence upon the medium 14 is reflected from the medium and sent through the aforementioned rod lens 13 and returned to the end surface of the electroluminescent semiconductor element 1.

In other words, the volume of the light returned to the element varies depending on the condition of the optical memory medium 14 at the point of light incidence. For example, when the light strikes the region 15 of high reflectivity, the amount of light returned is large while, when the light strikes the non-reflective region 16, the amount of light returned is much less.

Figure 5A:
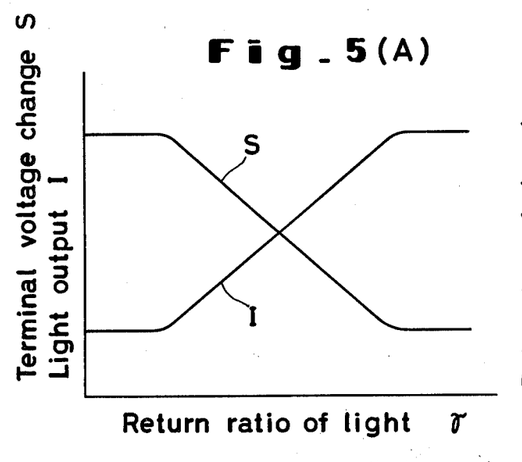
FIG. 5(A) is a graph showing the relation between the return ratio of light and the light output and the relation between the return ratio of light and the terminal voltage change of the electroluminescent semiconductor element.

FIG. 5(A) is a characteristic diagram showing the relation between the volume of returned light $\gamma \cdot I$, and the characteristics of the electroluminescent semiconductor element 1. Generally, the light output "I" increases in proportion as the return ratio of light "$\gamma$" increases as indicated by the curve "I" in the graph. While the return ratio of light "$\gamma$" is small, the light output is not appreciably affected. As the return ratio of light "$\gamma$" increases, the self-coupling effect becomes conspicuous and the light output "I" increases. When the return ratio of light "$\gamma$" increases too much, however, the light output becomes saturated. The terminal voltage change "S" of the electroluminescent semiconductor element generally increases in magnitude as the return ratio of light "$\gamma$" increases as shown by the curve "S" in the graph.

Figure 5B:
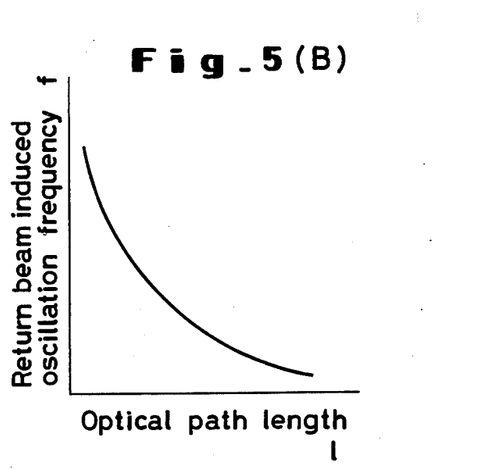
FIG. 5(B) is a graph showing the relation between the optical path length and the return-beam induced oscillation frequency.

Furthermore, the light output and the terminal voltage change "S" include a high-frequency oscillation component whose frequency depends on the length of the light path between the electroluminescent semiconductor element 1 and the optical memory medium 14. This phenomenon in the electroluminescent semiconductor element is called "return-beam induced oscillation" and is peculiar to the self-coupling effect. FIG. 5(B) illustrates the dependence of the frequency "f" of the oscillation induced by the returned light upon the length of light path "l". From this graph, it is evident that the frequency "f" decreases with the increasing length of light path "l". This characteristic curve as a whole moves upwardly in proportion as the electric current "J" flowing into the semiconductor element 1 increases. Where the operating conditions are fixed, the frequency "f" is determined by the length of light path "l".

This invention effects the reading-out of the information and the reproduction of the information by processing the electrical change which is caused by the impingement of the returned light upon the element. As the electroluminescent semiconductor element, the apparatus of the present invention uses either an electroluminescent diode or semiconductor laser.

The lens 13 to be used for the apparatus may be of any type insofar as it possesses a focusing property. Particularly, use of a well-known cylindrical lens having the same operating principle as the focusing optical fiber which has its refractive index gradually decreased from the axis to the periphery readily serves to enchance the accuracy with which the light spot of the electroluminescent semiconductor element is focused on the optical memory medium.

As regards the optical memory medium 14 which serves the purpose of storing the information in the apparatus of this invention, the material, shape, size and design are not critical so far as the medium is capable of modulating the incident light from the electroluminescent semiconductor element. Usually, storage of information on this medium is accomplished by forming or not forming minute recesses in the memory zone on the surface of a glass or plastic substrate. The memory medium containing such minute recesses may have a metallic or other material vacuum-deposited thereon.

Figure 4:
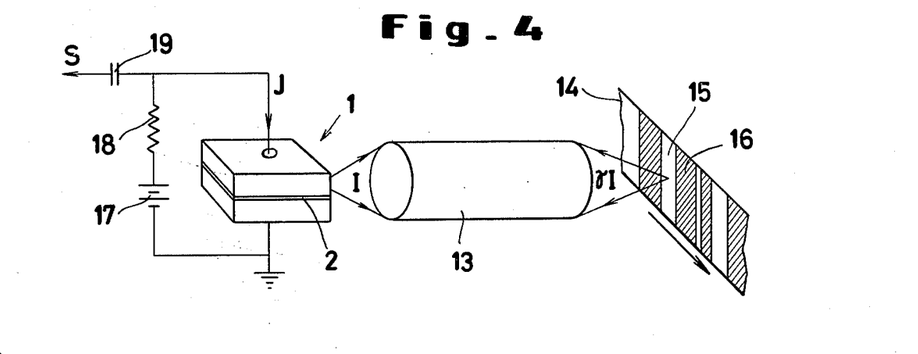
FIG. 4 is an explanatory view illustrating one embodiment of the optical memory playback apparatus according to the present invention.

For the detection or processing of the change caused in the electroluminescent semiconductor element by the returned light, the element 1 is electrically connected with a DC power source 17, a resistor 18 and a capacitor 19 through which the change in the terminal voltage of the element 1 is transferred, as shown in FIG. 4 which depicts one embodiment of the present invention. When the voltage between the terminals 7, 8 of the electroluminescent semiconductor element 1 is changed by the self-coupling effect due to the returned light, this change is coupled to a succeeding circuit as voltage change "S" through the capacitor 19. In the case of a GaAlAs laser which is a typical electroluminescent semiconductor element, for example, the terminal voltage change "S" is on the mV order and the frequency of the oscillation "f" induced by the returned light is on the order of 100 MHz under normal self-coupling conditions. Generally, the playback of the information stored in this optical memory medium is accomplished by amplifying the terminal voltage change "S" with a known amplifier and then processing the amplified voltage change by means of an electronic circuit to be described in full detail afterward.

One example of the optical memory playback apparatus of this invention which operates on the basic principle described above will be explained with reference to FIG. 6. The electroluminescent semiconductor element 1 and the rod lens 13 are set in position at a fixed distance from each other inside a cartridge 20, with their optical axes exactly coinciding. Two receptacles 21, 22 are formed in the upper surface of the cartridge 20 to accommodate terminal pins 23, 24 planted in and protruding from the lower surface of a cartridge holder 25. Through this accommodation, the cartridge 20 and the cartridge holder 25 are fastened to each other in a freely detachable state. The positive and negative terminals 7, 8 of the electroluminescent semiconductor element 1 are electrically connected with the aforementioned receptacles 23, 24. The terminal pin 23 is electrically connected with the positive side of the DC power source 17 and the terminal pin 24 with the negative side of the DC power source 17 respectively. The output signal from the positive terminal 7 of the electroluminescent semiconductor element 1, namely the terminal voltage change "S" which brings about the self-coupling effect of the element 1, is forwarded via the capacitor 19 to the signal processing unit 26.

Figure 6:
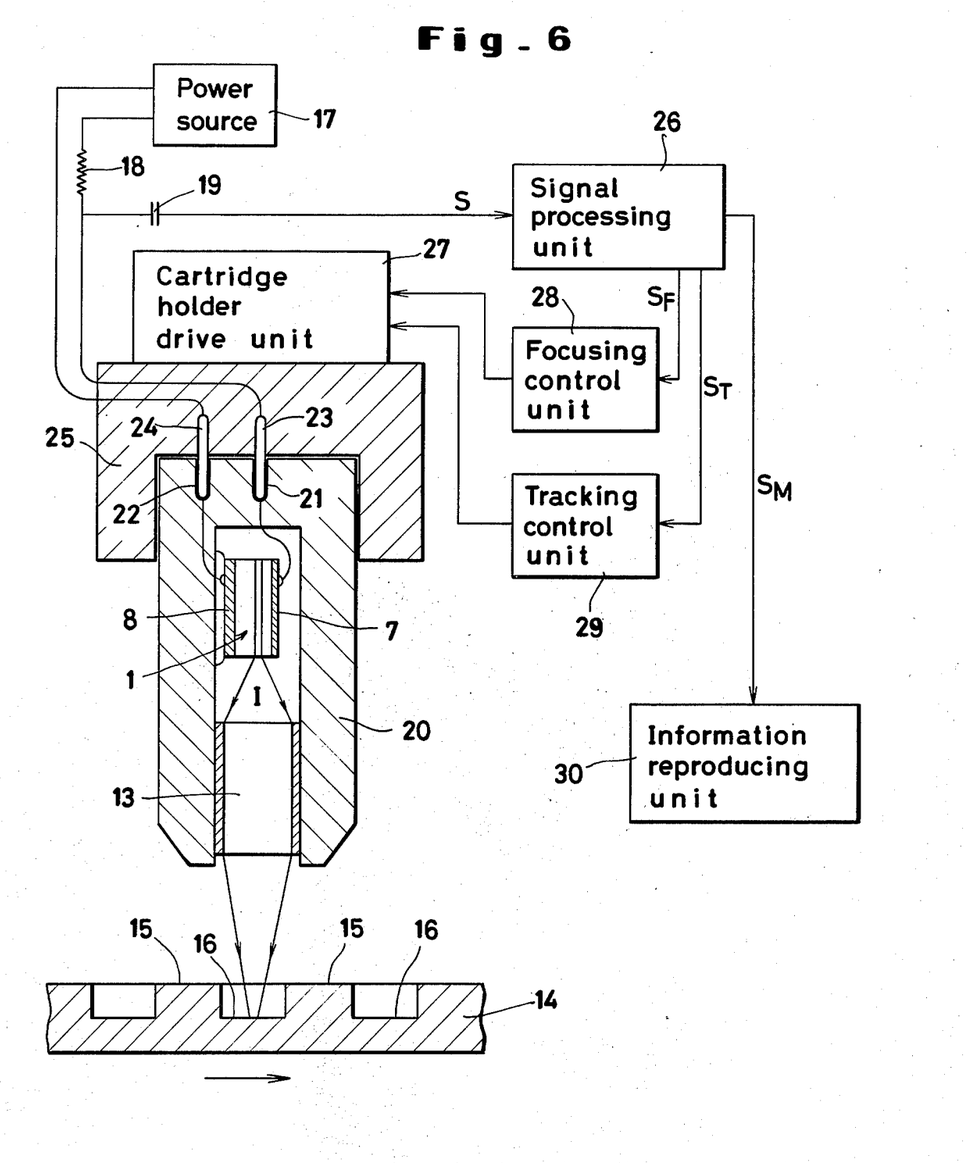
FIG. 6 is an explanatory view illustrating a concrete structure of the optical memory playback apparatus according to the present invention.

From the signal processing unit 26, there are simultaneously issued the signal $S_M$ for the reproduction of the information stored in the optical memory medium 14, the signal $S_F$ for the correction of the perpendicular position of the focal point of the light emitted from the cartridge 20 toward the optical memory medium, and the signal $S_T$ for the correction of the lateral position of the focal point. The signal $S_F$ is received by the focusing control unit 28 to effect required control of the perpendicular movement of the cartridge holder drive unit 27 and the signal $S_T$ is received by the tracking control unit 29 to effect required control of the lateral movement of the holder drive unit 27. This holder drive unit 27 is mechanically connected with the cartridge holder 25.

The playback signal $S_M$, when the apparatus 30 is operated for audio information, is delivered in the form of acoustic signal to an audio device such as a speaker. When the apparatus is operated for video information, this playback signal is delivered in the form of image signal to a video device such as a TV set. In the case of ordinary data, the signal is delivered in the form of letters, figures, etc. to various peripheral display devices and displayed thereon.

Now, the operation of the optical memory playback apparatus of this invention possessing the construction described above will be described.

The cartridge 20 is retained at a pre-defined distance from the optical memory medium 14. On this medium 14, optical memory regions 15, 16 are continually formed in the form of a track. As the cartridge 20 or the medium 14 is moved at a prescribed speed (the drive means for this purpose not shown), the light emitted from the electroluminescent semiconductor element 1 held inside the cartridge 20 is passed through the rod lens 13 and focused on the medium 14. When the focused light impinges upon the optical memory region 15 which has a high reflection factor, the return ratio of light to the element is high enough so that the terminal voltage change "S" forwarded to the signal processing unit is enhanced by the self-coupling effect. When the focused light impinges upon the optical memory region 16 which has a low reflection factor, the return ratio of light is lowered and the terminal voltage change "S" is lowered.

In the manner described above, the bits of information stored in the memory medium are sequentially converted into corresponding changes in terminal voltage change and reproduced by the signal processing unit 26 as the bits of information successively move to fall on the optical axis of the element. When the information is in the form of audio signals, it is delivered to a speaker. When it is in the form of video signals, it is sent to a peripheral device such as a TV set and displayed thereon.

When the position at which the light emitted from the element 1 to the medium 14 is focused deviates from the position at which the information is stored or when the radiated light fails to be correctly focused on the medium, the extent of the change in the terminal voltage change "S" is decreased to a point where the information will possibly be read out incorrectly.

To preclude this possible incorrect reading of information, the signal $S_F$ and the signal $S_T$ are issued from the signal processing unit 26 to the focusing control unit 28 and the tracking control unit 29 respectively.

The focusing control unit 28 has the maximum allowable value of the signal $S_f$ (FIG. 8) stored in advance therein. It compares the signal $S_f$ received from the signal processing unit 26 with the pre-stored maximum value and, when the value of this signal $S_f$ is smaller than the value, sends a signal to the holder drive unit 27 so that the cartridge 20 is moved in the direction perpendicular to the medium by a suitable drive device such as an electromagnet to bring the signal $S_f$ to the maximum value.

The absence of correct focusing implies an unwanted change in the length of the light path between the electroluminescent semiconductor element and the optical memory medium 14. In this case, desired correct focusing can be obtained by detecting with the signal processing unit the change in the frequency of the aforementioned return-beam induced oscillation included in the terminal voltage change "S" and sending a proper signal via the focusing control unit 28 to the holder drive unit thereby adjusting the position of the cartridge and giving to the light path a length proper for the oscillation to be produced at a right frequency.

It is clear that the return beam induced oscillation can also be utilized as the memory playback signal $S_M$.

The tracking control unit 29 has a minimum allowable value of the signal $S_p$ (FIG. 8) stored in advance therein. It compares the signal $S_p$ received from the signal processing unit 22 with the pre-stored minimum value and, when the value of the signal $S_p$ is smaller than the minimum value, sends a signal to the holder drive unit 27 so that the cartridge is finely moved in its lateral direction to give a required change to the position at which the light emitted from the cartridge 20 impinges upon the medium 14. The cartridge is brought to a stop at the position at which the value of the signal $S_p$ is brought to the minimum value of the signal $S_p$. Consequently, the emitted light impinges correctly on the position of the information storage medium 14 at which the information is stored and the information is correctly read out.

When the focal point of the incident light deviates either laterally or perpendicularly from the regions 15, 16 of the optical memory, the signal processing unit 26 simultaneously carries out the two types of detection/processing to eliminate the deviation at once.

The focusing control and the tracking control mentioned above can be accomplished by means of known electronic circuits and feedback mechanisms.

Figure 7:
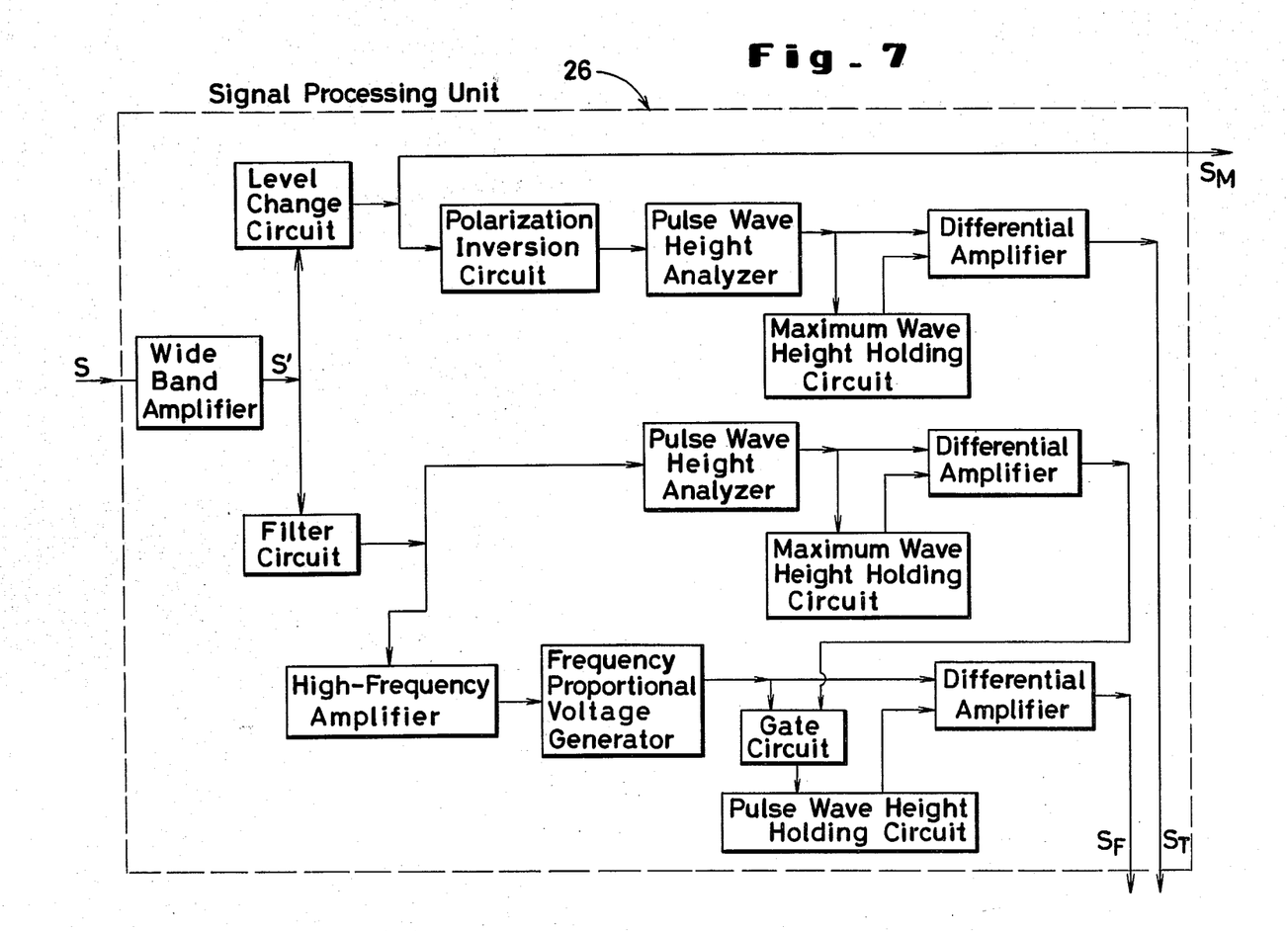
FIG. 7 is an explanatory view illustrating one embodiment of the signal processing unit of the optical memory playback apparatus according to the present invention.

More detailed explanation of the signal processing unit of the optical playback apparatus according to the present invention will be given in the following with reference to FIG. 7.

Figure 8:
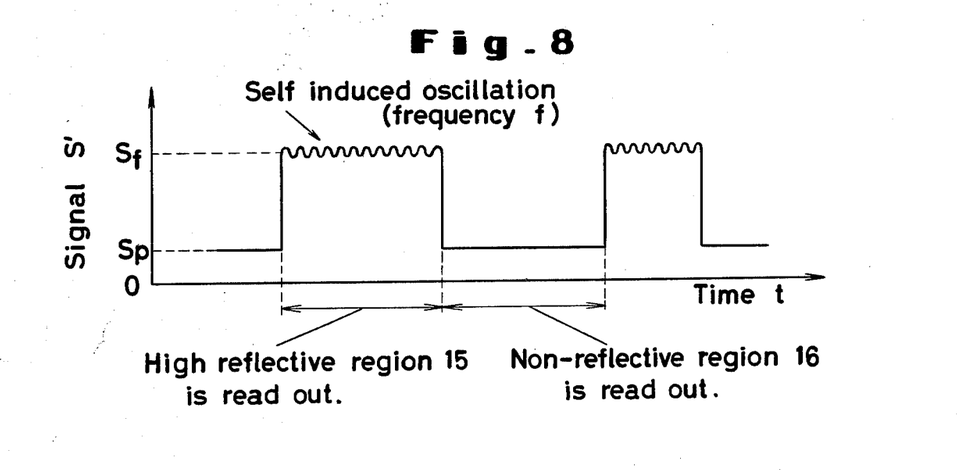
FIG. 8 is an explanatory view illustrating the variation in terminal voltage change of the electroluminescent semiconductor element of the optical memory playback apparatus according to the present invention.

In the signal processing unit 26, the terminal voltage "S" of the electroluminescent semiconductor element 1 is amplified with a wide band amplifier into a signal S' having a pulse-like wave form as shown in FIG. 8. $S_f$ in FIG. 8 denotes the level of the signal S' when the element 1 reads out the high reflection region 15 of the medium 14 and $S_p$ denotes the level of the signal S' when the element 1 reads out the nonreflective region 16, and the signal S' of the $S_f$ level includes a high-frequency return-beam induced oscillation component whose frequency "f" depends on the length of the light path.

When the light directed toward the optical memory medium 14 is correctly focused, the level $S_f$ becomes equal to $S_{fo}$ which is the maximum level and the frequency "f" becomes equal to "fo" which is the central frequency. When the focusing is improper, $S_f$ becomes lower than $S_{fo}$ and "f" becomes either larger or smaller than "fo" depending upon the position of the optical memory medium 14 relative to the position of the electroluminescent semiconductor element 1.

On the other hand, when there is no tracking error, the level $S_p$ becomes equal to $S_{po}$ which is the minimum level. If a tracking error occurs, $S_p$ becomes larger than $S_{po}$.

In order to obtain the signal $S_M$ for the reproduction of the information stored in the optical memory medium under the best conditions, the level of the signal S' is detected to cause the focusing and tracking to be correctly carried out and the signal S' is applied to a level change circuit so that the signal of the $S_f$ level becomes a positive pulse and that of the $S_p$ level becomes a negative pulse and is also applied to a filter circuit which removes the high-frequency oscillation component from the signal S'.

The output from the level change circuit is sent to an information-reproducing apparatus 30, such as a speaker in the case of an audio signal, a video display device in the case of a video signal, as the information-reproducing signal $S_M$. It is also forwarded through a polarization inversion circuit and a pulse wave height analyzer to a maximum wave height holding circuit which memorizes the minimum level $S_{po}$. The difference between the outputs from the maximum wave height holding circuit and from the pulse wave height analyzer is amplified with a differential amplifier into a tracking control signal $S_T$ which is in proportion to $S_p - S_{po}$.

The high-frequency oscillation component of the output from the filter circuit is forwarded to a pulse wave height holding circuit through a high-frequency amplifier, a frequency proportional voltage generator and a gate circuit. On the other hand, the $S_f$ level component of the output of the filter circuit is sent to a pulse height analyzer which is connected with a maximum wave holding circuit and a differential amplifier which, in the same manner as described in connection with the signal $S_p$, produces an output proportional to $S_{fo} - S_f$. This output is applied to the other terminal of the gate circuit so as to close the gate circuit when $S_{fo} - S_f > 0$. As a consequence, the pulse wave height holding circuit memorizes a signal proportional to "fo" and, similarly to the case of $S_p$, a focusing control signal $S_F$ proportional to $f - fo$ is obtained from the differential amplifier.

Figure 9:
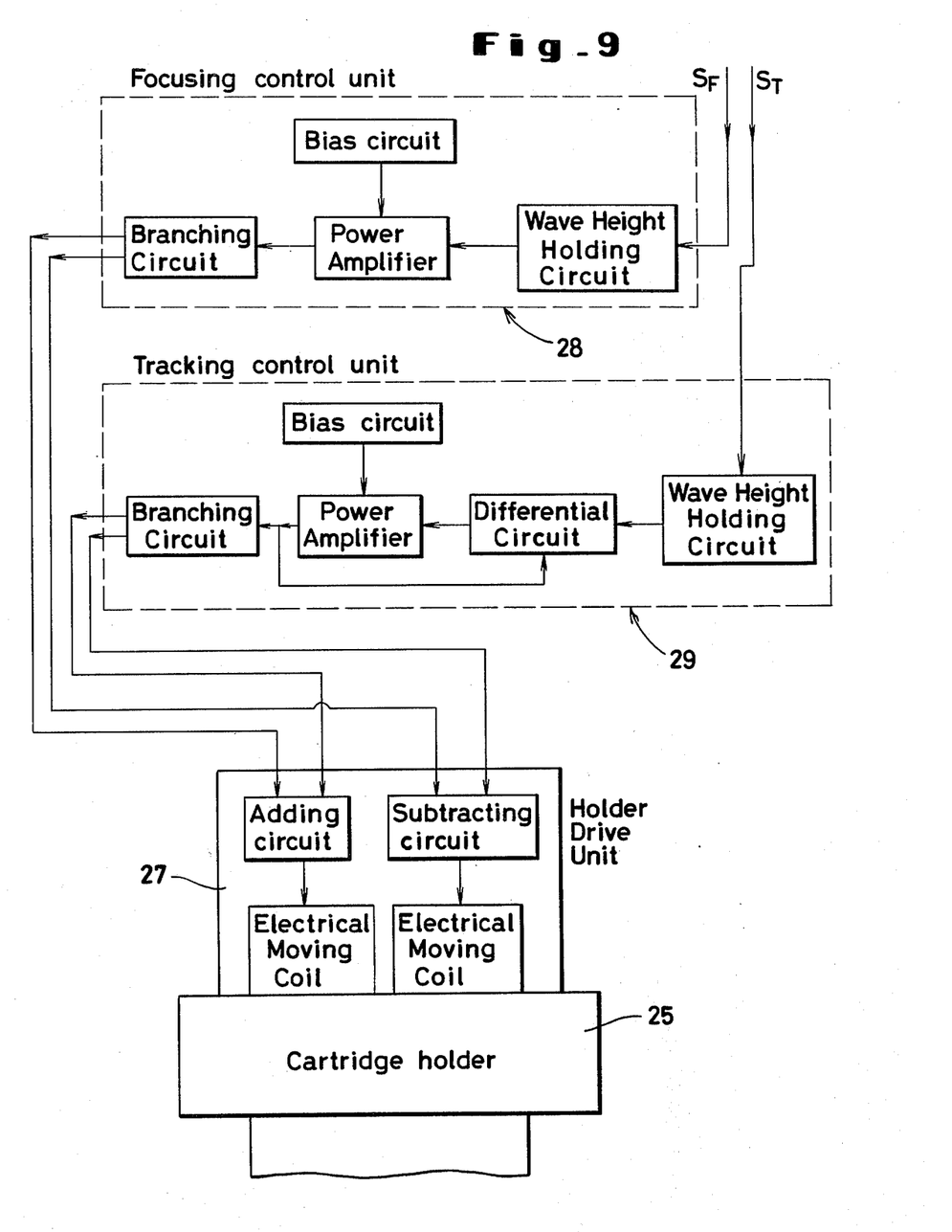
FIG. 9 is an explanatory view illustrating one embodiment of the focusing and tracking units of the optical memory playback apparatus according to the present invention.

The signals $S_F$ and $S_T$ from the signal processing unit 26 are applied to the focusing control unit 28 and the tracking control unit 29, respectively as shown in FIG. 9. In these control units the pulse-like signals $S_F$ and $S_T$ are converted into continuous wave signals. $S_F$ is then passed directly to a power amplifier whereas $S_T$ is passed to a power amplifier via a differentiation circuit for the purpose of monitoring the results of the tracking control and determining the direction in which adjustment is required. Each of the power amplifiers has a bias circuit connected thereto for the purpose of controlling its output level. The output of each power amplifier is forwarded to a branching circuit capable of producing two electrically isolated outputs for forwarding to the holder drive unit 27.

In the holder drive unit 27, the outputs of the two branching circuits are paired in such manner that one pair produces a sum signal while the other pair produces a difference signal. The sum and difference signals are applied to, for example, the coils of separate electromagnets. With this arrangement, the coils of the two electromagnets will be urged to move in the same direction in response to $S_F$ causing a perpendicular movement of the cartridge holder 25, and in opposite directions in response to $S_T$ causing its lateral movement. Thus the cartridge holder 25 to which these coils are connected will be moved so as to correct the focusing and tracking of the light directed from the cartridge 20 toward the memory medium 14 so as to assure accurate read-out of the recorded information.

As described in detail above, the optical memory playback apparatus of the present invention utilizes the self-coupling effect of the electroluminescent semiconductor element. When the light radiated from the element is affected by the memory medium, the light reflected back into the element causes the terminal voltage to be changed corresponding to the return ratio of light without reference to the phase or wavefront of the returned light. Thus, the length of the light path between the element and the medium can be freely selected and the structure of the apparatus can be simplified, contributing greatly to the size reduction of the entire apparatus.

Even if the focal point of the radiated light deviates from the position of the medium at which the information is stored, the apparatus of this invention does not suffer from incorrect reading of the information because it immediately responds to make a proper adjustment for the emitted light to be focused at the correct position.

What is claimed is:

1. An optical memory playback apparatus, which comprises:
   a medium having information stored therein in the form of an arrangement of reflective regions and nonreflective regions,
   an electroluminescent semiconductor element adapted to emit a light through one end surface thereof for reading out the information from the medium,
   a rod lens serving to lead the light emitted from the electroluminescent semiconductor element onto the medium and return the light reflected from the medium to the end surface of the electroluminescent semiconductor element,
   a cartridge having the electroluminescent semiconductor element and the rod lens incorporated therein with their optical axes coinciding with each other, a cartridge holder drive means having the cartridge held in a state freely movable in the lateral direction and the perpendicular direction with respect to the medium,
   a signal processing unit serving to detect the change of terminal voltage of the electroluminescent semiconductor element due to the self-coupling effect brought about by the returned light from the medium,
   an information reproduction means for reproducing the information in accordance with the signal received from the signal processing unit,
   a focusing control means serving to issue a signal to the cartridge holder drive means in accordance with the signal from the signal processing unit for thereby controlling the focal point of the light being sent to the medium, and
   a tracking control means serving to issue a signal to the cartridge holder drive means in accordance with the signal from the signal processing unit for thereby controlling the tracking of the light being sent to the medium.

2. An optical memory playback apparatus according to claim 1, wherein said electroluminescent semiconductor element is a semiconductor laser.

3. An optical memory playback apparatus according to claim 1, wherein said electroluminescent semiconductor element is a light emitting diode.

* * * * *